(12) United States Patent
Zhou et al.

(10) Patent No.: US 11,934,222 B2
(45) Date of Patent: Mar. 19, 2024

(54) ATTACHING APPARATUS AND ATTACHING METHOD

(71) Applicant: BOE Technology Group Co., Ltd., Beijing (CN)

(72) Inventors: Yonghong Zhou, Beijing (CN); Meiling Gao, Beijing (CN); Shengxing Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 197 days.

(21) Appl. No.: 17/772,548

(22) PCT Filed: May 17, 2021

(86) PCT No.: PCT/CN2021/094222
§ 371 (c)(1),
(2) Date: Apr. 28, 2022

(87) PCT Pub. No.: WO2021/258918
PCT Pub. Date: Dec. 30, 2021

(65) Prior Publication Data
US 2022/0404865 A1  Dec. 22, 2022

(30) Foreign Application Priority Data

Jun. 24, 2020 (CN) .......................... 202010588539.9

(51) Int. Cl.
*H05K 1/18* (2006.01)
*G06F 1/16* (2006.01)

(52) U.S. Cl.
CPC ............ *G06F 1/1607* (2013.01); *H05K 1/189* (2013.01); *H05K 2201/10431* (2013.01)

(58) Field of Classification Search
CPC .................. G06F 1/1607; H05K 1/189; H05K 2201/10431

(Continued)

(56) References Cited

U.S. PATENT DOCUMENTS 8,035,789 B2  10/2011  Yamada
2004/0253782 A1*  12/2004  Kondo ................ H01L 27/1214
                                                                                      438/222

(Continued)

FOREIGN PATENT DOCUMENTS

CN   105430889 A   3/2016
CN   107942563 A   4/2018

(Continued)

OTHER PUBLICATIONS

International Search Report dated Aug. 17, 2021 in International Application No. PCT/CN2021/094222, 4 pages.

(Continued)

*Primary Examiner* — Binh B Tran
(74) *Attorney, Agent, or Firm* — XSENSUS LLP

(57) ABSTRACT

The present disclosure relates to an attaching apparatus (2) and an attaching method. The attaching apparatus (2) includes: an auxiliary attaching structure having a protective film layer (20) and a support part (21), and the protective film layer (20) includes first areas (20a) and second areas (20b), each first area (20a) is configured to correspond to an installation area (10a), first sides of the first areas (20a) can be attached to body parts (13a) of rigid structural members on the installation areas (10a) corresponding to the first areas (20a) and receiving through holes (20c) or receiving recesses (20d) are formed at positions on the first areas (20a) corresponding to installation protrusions (13b), the second areas (20b) are configured to correspond to bending areas (10b); and a laminating jig (22) that can be located on a second side of the protective film layer (20).

20 Claims, 10 Drawing Sheets

(58) Field of Classification Search
USPC .................................................. 361/679.21
See application file for complete search history.

(56) References Cited

U.S. PATENT DOCUMENTS

2008/0232047 A1     9/2008  Yamada
2017/0318690 A1*   11/2017  Jung .................. B29C 65/4845
2019/0318689 A1    10/2019  Kim

FOREIGN PATENT DOCUMENTS

| | | |
|---|---|---|
| CN | 108182879 A | 6/2018 |
| CN | 109448552 A | 3/2019 |
| CN | 109950184 A | 6/2019 |
| CN | 110278668 A | 9/2019 |
| CN | 110278668 B | 1/2021 |
| CN | 109950184 B | 3/2021 |
| WO | 2020/207212 A1 | 10/2020 |

OTHER PUBLICATIONS

Written Opinion of the International Searching Authority dated Aug. 17, 2021 in International Application No. PCT/CN2021/094222, 2 pages.

* cited by examiner

ATTACHING APPARATUS AND ATTACHING METHOD

CROSS-REFERENCE

The present application is the 371 application of PCT Application No. PCT/CN2021/094222, filed on May 17, 2021, which is based upon and claims the priority to the Chinese Patent Application NO. 202010588539.9, entitled "ATTACHING APPARATUS AND ATTACHING METHOD", filed on Jun. 24, 2020, the entire contents of which are hereby incorporated by reference.

TECHNICAL FIELD

The present disclosure relates to the field of display technologies, and in particular, to an attaching apparatus and an attaching method.

BACKGROUND

At present, display products have been widely used in various fields, such as a mobile phone field, a computer field, a watch field, a wristband field, and a vehicle-mounted device field. Therefore, requirements for forms of the display products are increasingly demanding. In order to make the display products meet various form requirements, the display products are usually designed to be flexible, so that the display products can be curved or bent into different forms.

It should be noted that the information disclosed in the Background section above is only for enhancing the understanding of the background of the present disclosure, and thus may include information that does not constitute prior art known to those of ordinary skill in the art.

SUMMARY

The present disclosure provides an attaching apparatus and an attaching method.

A first aspect of the present disclosure provides an attaching apparatus, wherein the attaching apparatus is used for attachment of a display device, and the display device includes: a flexible touch display substrate, a main flexible circuit board, a touch flexible circuit board, and a plurality of rigid structural members to be fitted in a complete machine; the flexible touch display substrate includes a touch display part and a binding part coupled to the touch display part, and the touch display part includes at least two installation areas arranged at intervals in a first direction and a bending area located between adjacent installation areas; a back of each installation area is provided with an adhesive layer, and a rigid structural member is installed on the adhesive layer of the installation area; the rigid structural member has a body part and an installation protrusion formed on the body part and protruding in a direction away from the touch display part; the main flexible circuit board is electrically coupled to the binding part and the main flexible circuit board is disposable on a body part of a rigid structural member corresponding to an installation area; and one end of the touch flexible circuit board is electrically coupled to the touch display part, and the other end is bendable to a body part of a rigid structural member corresponding to another installation area; wherein:

the attaching apparatus includes:

an auxiliary attaching structure, including a protective film layer and a support part; wherein the protective film layer has a first side and a second side opposite in a thickness direction of the protective film layer, the thickness direction is orthogonal to the first direction; the protection film layer includes at least two first areas arranged at intervals in the first direction and a second area located between adjacent first areas; each first area is used for corresponding to one installation area, the first side of the first area is attachable to a body part of a rigid structural member on the installation area corresponding to the first area, and a position on the first area corresponding to the installation protrusion is opened with an avoidance through hole or an avoidance groove; the second area is used for corresponding to the bending area; the support part is disposed on the first side of the second area, and the support part is in contact with the bending area after the first side of the first area is attached to the body part of the rigid structural member corresponding to the first area; and a pressing jig, located on the second side of the protective film layer; wherein the pressing jig is capable of applying a pressure to the protective film layer after the first side of the first area is attached to the body part of the rigid structural member corresponding to the first area, so that the rigid structural member is attached to the installation area through the adhesive layer.

A second aspect of the present disclosure provides an attaching method, which adopts the attaching apparatus described in any one of the above embodiments; and the attaching method includes:

placing the flexible touch display substrate on a worktable;

forming the adhesive layer on the back of each installation area of the flexible touch display substrate;

placing at least one rigid structural member on the adhesive layer of each installation area;

attaching the first side of the first area of the protective film layer to the body part of the rigid structural member on the installation area corresponding to the first area, while positioning the support part between adjacent rigid structural members and making the support part in contact with the bending area; and disposing the pressing jig on the second side of the protective film layer, and making the pressing jig apply a pressure to the protective film layer, so that the rigid structural member is attached to the installation area through the adhesive layer.

It should be noted that the above general description and the following detailed description are merely exemplary and explanatory and should not be construed as limiting of the disclosure.

BRIEF DESCRIPTION OF THE DRAWINGS

The accompanying drawings are used to provide a further understanding of embodiments of the present disclosure, and constitute a part of the disclosure, and serve to explain the present disclosure together with the embodiments of the present disclosure but do not limit the present disclosure. Above and other features and advantages will become more apparent to those skilled in the art by describing the embodiments in detail with reference to the attached drawings, in which.

DETAILED DESCRIPTION

Figure 1:
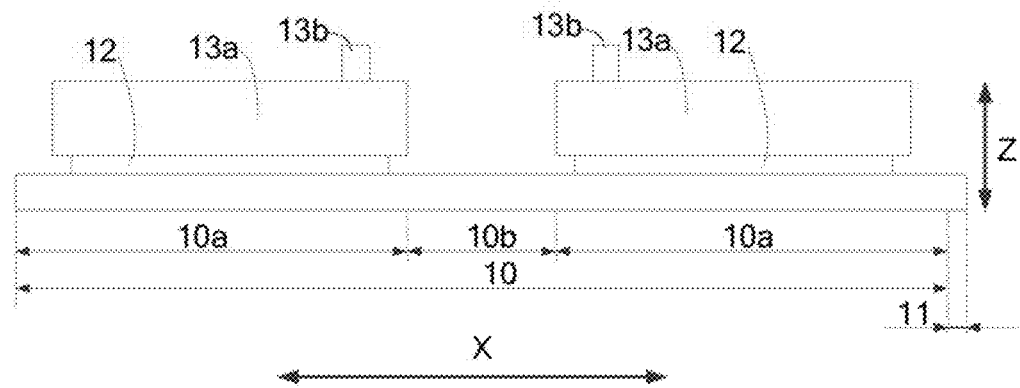
FIG. 1 and FIG. 2 are schematic structural diagrams of display devices under a first viewing angle according to different embodiments of the present disclosure.

The technical solutions of the present disclosure will be described in further detail below through embodiments and in conjunction with the accompanying drawings.

The embodiments will now be described more fully with reference to the accompanying drawings. However, the embodiments can be implemented in a variety of forms and should not be construed as being limited to the examples set forth herein; rather, these embodiments are provided so that the present disclosure will be full and complete so as to convey the idea of the embodiments to those skilled in the art. The same reference numerals in the drawings denote the same or similar structures, and the repeated description thereof will be omitted.

Although relative terms such as "above" and "below" are used in the specification to describe a relative relationship of one component to another component shown, these terms are only for convenience in this specification, for example, according to an exemplary direction shown in the drawings. It will be understood that if an apparatus shown is flipped upside down, the component described as "above" will become a component "below" another component. When a structure is "on" another structure, it may mean that the structure is integrally formed on another structure, or that the structure is "directly" disposed on another structure, or that the structure is "indirectly" disposed on another structure through other structures.

The terms "one", "a", "the" and "said" are used to indicate that there are one or more elements/components or the like; the terms "include" and "have" are used to indicate an open meaning of including and mean that there may be additional elements/components/etc. in addition to the listed elements/components/etc.

As shown in FIG. 1, an embodiment of the present disclosure provides a display device 1, which includes a flexible touch display substrate and a plurality of rigid structural members. The flexible touch display substrate can be an organic light emitting diode (OLED) display substrate, but is not limited thereto, and can also be a liquid crystal display substrate, etc. It should be understood that a rigidity of the rigid structural member is greater than a rigidity of the flexible touch display substrate, the rigid structural member can be installed in a partial area of the flexible touch display substrate, and the rigid structural member can be used to be fitted in a complete machine. In this way, the installation of the flexible touch display substrate in the complete machine can be facilitated, while ensuring that the flexible touch display substrate has a certain bending performance.

As shown in FIG. 1, the flexible touch display substrate may include a touch display part 10 and a binding part 11 coupled to the touch display part 10, the touch display part 10 may include at least two installation areas 10a arranged at intervals in a first direction X and a bending area 10b between adjacent installation areas 10a. A back of each installation area 10a may be provided with an adhesive layer 12, and at least one rigid structural member mentioned above can be installed on the adhesive layer 12 of each installation area 10a.

It should be noted that the touch display part 10 includes a display function layer and a touch function layer, and the touch function layer can be disposed on a display face of the display function layer. In addition, it should be understood that the back of the installation area mentioned in the embodiments of the present disclosure is a non-display face opposite to the display face in the touch display part 10.

As shown in FIG. 1, the rigid structural member may have a body part 13a and an installation protrusion 13b and the installation protrusion 13b is formed on the body part 13a and protrudes in a direction away from the touch display part 10. For example, the installation protrusion 13b can be integrally formed with the body part 13a, and the installation protrusion 13b can also be installed on the body part 13a by means of bonding. The installation protrusion 13b can be an internal thread structure, such as a nut, which can be installed in the complete machine through a screw, but it is not limited to this. The installation protrusion can also be an external thread structure (such as a bolt, the screw, etc.) or a structure such as a snapping protrusion, so as to be installed in the complete machine.

Figure 3:
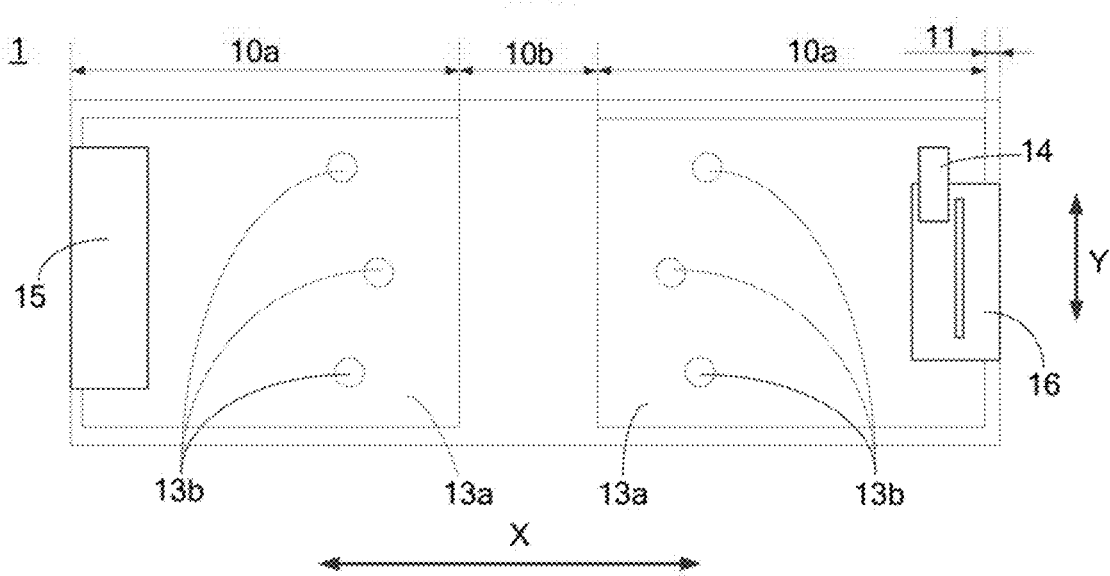
FIG. 3 is a schematic structural diagram of a display device under a second viewing angle according to an embodiment of the present disclosure.

It should be noted that, as shown in FIG. 3, there may be a plurality of installation protrusions 13b on each body part 13a, and the plurality of installation protrusions 13b may be distributed on the body part 13a as needed.

For example, a material of the rigid structural member may include a metal element such as aluminum and copper, that is to say, the material of the rigid structural member may be at least one of a metal material and an alloy material, such as: an aluminum material, a copper material and other metal materials, an aluminum alloy, stainless steel, a copper alloy and other alloy materials. In this way, a heat dissipation performance of the rigid structural member can be improved, while ensuring the rigidity of the rigid structural member. However, it should be understood that the material of the rigid structural member is not limited to the metal material or the alloy material, and may also be a plastic material, such as polyethylene terephthalate (PET), or a composite material including metal and plastic materials, which depends on a specific situation.

Figure 2:
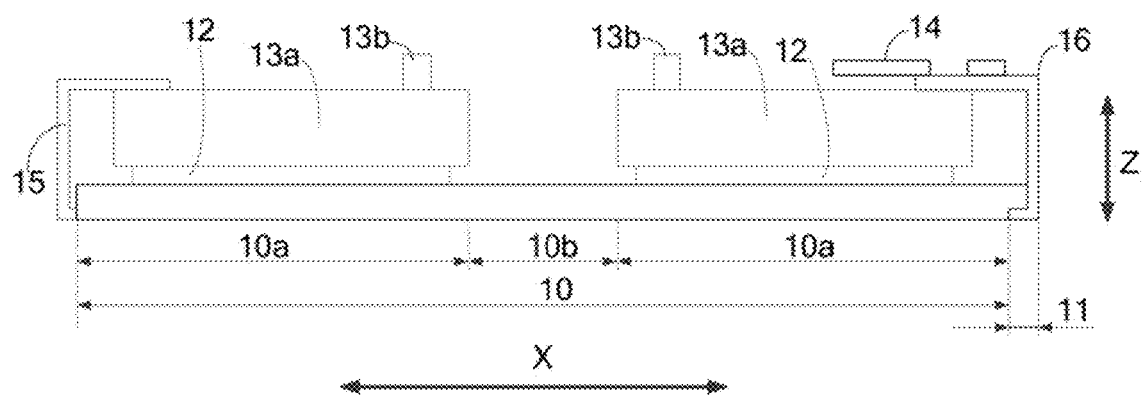

It should be noted that, as shown in FIGS. 2 and 3, the display device 1 may further include a main flexible circuit board 14 and a touch flexible circuit board 15, and the main flexible circuit board 14 is electrically coupled to the binding part 11. The main flexible circuit board 14 can be disposed on a body part 13a of a rigid structural member corresponding to an installation area 10a. Specifically as shown in FIG. 2, the main flexible circuit board 14 in the embodiments of the present disclosure can be coupled to the binding part 11 via a chip-on-flex (COF) 16. The chip-on-flex 16 is composed of a driving chip and a flexible circuit board, one end of the chip-on-flex 16 is coupled to the binding part 11, and the other end can be bent onto the body part 13a of the rigid structural member corresponding to the installation area 10a, that is to say, the display device 1 can adopt COF packaging technologies, but it is not limited to this. In the embodiments of the present disclosure, the binding part 11 of the flexible display substrate can be integrated with the driving chip; and the binding part 11 can be bent onto the body part 13a of the rigid structural member corresponding to the installation area 10a, and is electrically coupled to the main flexible circuit board 14, that is, the display device 1 can adopt chip-on-plastic (COP) packaging technologies.

As shown in FIG. 2 and FIG. 3, one end of the touch flexible circuit board 15 can be electrically coupled to the touch display part 10, which specifically can be electrically coupled to the touch function layer of the touch display part 10, and the other end can be bent onto a body part 13a of a rigid structural member corresponding to an installation area 10a. In the embodiments of the present disclosure, the touch flexible circuit board 15 and the main flexible circuit board 14 may correspond to different installation areas 10a, but are not limited thereto, and may also correspond to the same installation area 10a, depending on the specific situation.

Based on the above structure, an assembly method of the display device 1 according to the embodiments of the present disclosure may include: first placing the rigid structural member on the adhesive layer 12 of the installation area 10a; secondly, using a pressing jig to press the rigid structural member, so that the rigid structural member can be stably attached or laminated to the installation area 10a of the flexible touch display substrate; then disposing the main flexible circuit board 14 on a body part 13a of a rigid structural member corresponding to an installation area 10a; bending one end of the touch flexible circuit board 15 to a body part 13a of a rigid structural member corresponding to another installation area 10a.

However, since the display device 1 according to the embodiments of the present disclosure needs to be bent, the bending area 10b of the flexible touch display substrate cannot be provided with the rigid structural member with the relatively high rigidity, so that rigid structural members on the installation areas 10a on both sides of the bending area 10b are not continuous, that is, disconnected from each other. As a result, during a process of pressing the rigid structural member with the pressing jig for attaching, a stress at an edge of the rigid structural member is relatively concentrated, which results in uneven deformation of an edge of the adhesive layer 12, thereby causing unbalanced force on the flexible touch display substrate, and accordingly, there will be obvious film prints seen from the display face of the flexible touch display substrate.

In order to improve this situation, an embodiment of the present disclosure further provides an attaching apparatus for attachment of a display device. Specifically, this attaching apparatus, which is also referred as to the laminating apparatus or the fitting apparatus, is used to attach or laminate the plurality of rigid structural members to the flexible touch display substrate in the display device 1 described in any of the foregoing embodiments in FIGS. 1-3, and as shown in FIG. 4, the attaching apparatus 2 may include an auxiliary attaching structure and a pressing jig 22.

The auxiliary attaching structure may include a protective film layer 20 and a support part 21, the protective film layer 20 has a first side and a second side opposite in a thickness direction Z thereof, and the protective film layer 20 includes at least two first areas 20a arranged at intervals in the first direction X and a second area 20b located between adjacent first areas 20a, the first direction X is orthogonal to the thickness direction Z. As shown in FIG. 4, FIG. 5, and FIG. 9 to FIG. 11, each first area 20a is used to correspond to one installation area 10a, the first side of the first area 20a can be attached to the body part 13a of the rigid structural member on the installation area 10a corresponding to the first area 20a, and a position on the first area 20a corresponding to the installation protrusion 13b is opened with an avoidance through hole 20c or an avoidance groove 20d. The second area 20b is used to correspond to the bending area 10b, and the support part 21 is disposed on the first side of the second area 20b. After the first side of the first area 20a is attached to the body part 13a of the rigid structural member corresponding to the first area 20a, the support part 21 can be in contact with the bending area 10b. In other words, a thickness of the support part 21 may be substantially the same as a sum of thicknesses of the rigid structural member and the adhesive layer 12.

Figure 4:
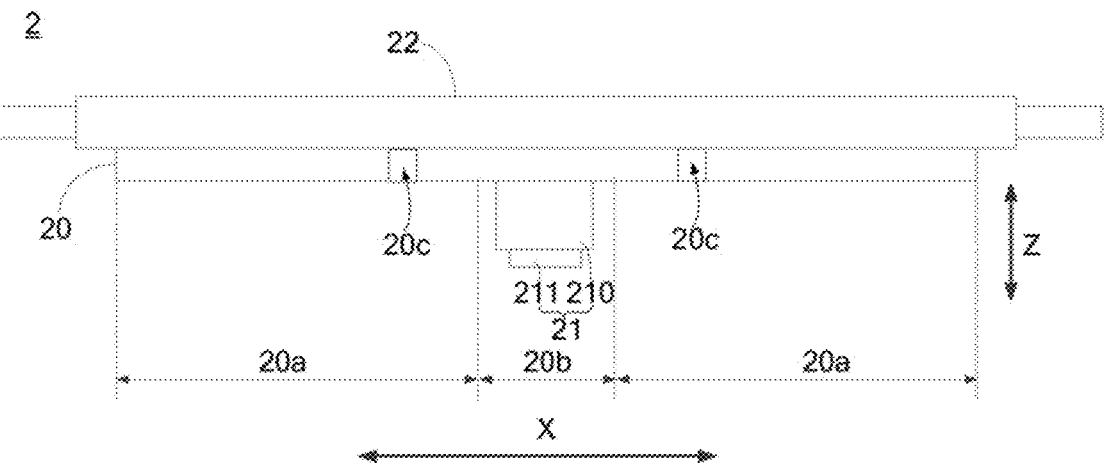
FIG. 4 and FIG. 5 are schematic diagrams of positional relationships between pressing jigs and auxiliary attaching structures in attaching apparatuses according to different embodiments of the present disclosure.
Figure 5:
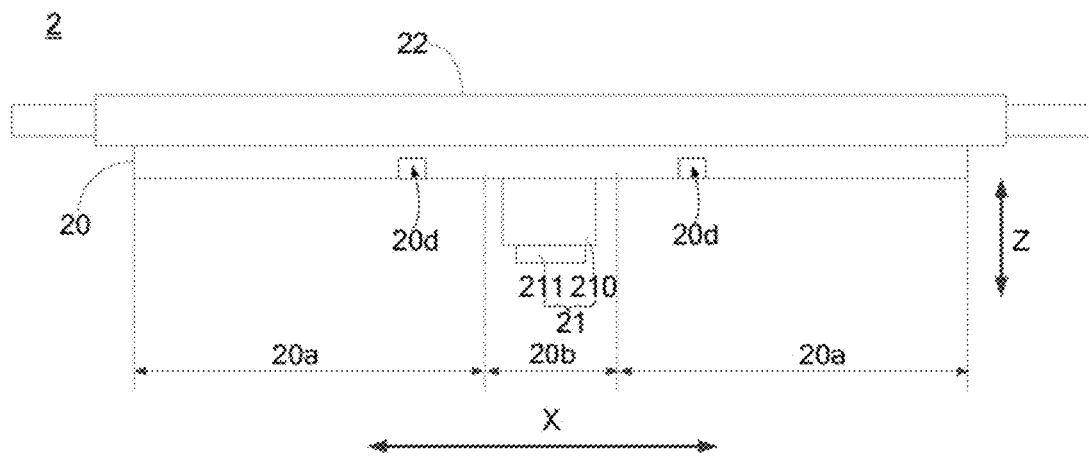

As shown in FIG. 4 and FIG. 5, the pressing jig 22 can be located on the second side of the protective film layer 20. After the first side of the first area 20a is attached to the rigid structural member corresponding to the first area 20a, the pressing jig 22 can apply a pressure force to the protective film layer 20 to make the rigid structural member attach to the installation area 10a through the adhesive layer 12.

Based on the attaching apparatus 2, a method for attaching the plurality of rigid structural members to the flexible touch display substrate in the display device 1 may include: firstly attaching the first side of the first area 20a of the protective film layer 20 to the body part 13a of the rigid structural member on the installation area 10a corresponding to the first area 20a, while positioning the support part 21 between adjacent rigid structural members and making it in contact with the bending area 10b; then disposing the pressing jig 22 on the second side of the protective film layer 20, and making the pressing jig 22 apply the pressure to the protective film layer 20, so that the rigid structural member is attached to the installation area 10a through the adhesive layer 12.

In the embodiments of the present disclosure, since the support part 21 can be in contact with the bending area 10b, the support part 21 can share the stress generated during the pressing process, so as to avoid the occurrence of relatively obvious film prints due to the stress concentration at the edge of the rigid structural member during the pressing process, thereby ensuring the quality of pressing and improving the appearance and texture of the product. In addition, during the attaching process of the rigid structural member and the flexible touch display substrate, the use of the auxiliary attaching structure can balance the stress in each area of the flexible touch display substrate, so as to avoid damage to the flexible touch display substrate.

It should be noted that, the protective film layer 20 in the embodiments of the present disclosure may be attached with the support part 21 and the rigid structural member by means of bonding. In addition, since the body part 13a of the rigid structural member in the embodiments of the present disclosure is typically a planar structure, the first side of the protective film layer 20 may be flat, so as to increase an attaching area of the protective film layer 20 with the body part 13a of the rigid structural member, thereby ensuring that the protective film layer 20 and the rigid structural member can be stably attached together during the attaching process. In addition, the second side of the protective film layer 20 in the embodiments of the present disclosure can also be flat, and such design can increase a contact area between the pressing jig 22 and the protective film layer 20 to avoid the problem of stress concentration during the pressing process, while also reducing the design difficulty of the pressing jig 22.

Figure 6:
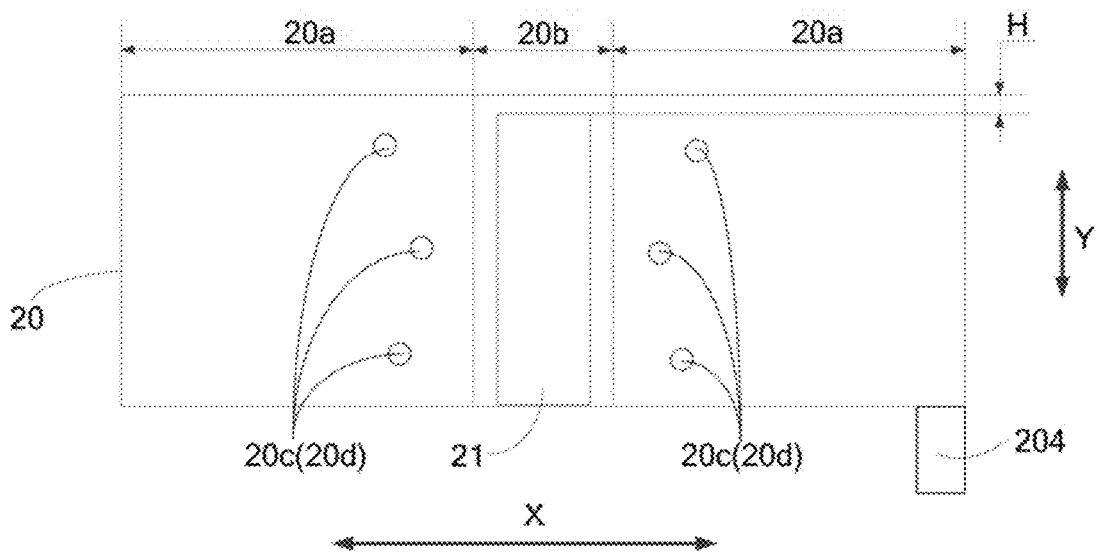
FIG. 6 is a schematic structural diagram of an auxiliary attaching structure in an attaching apparatus under a third viewing angle according to an embodiment of the present disclosure.
Figure 7:
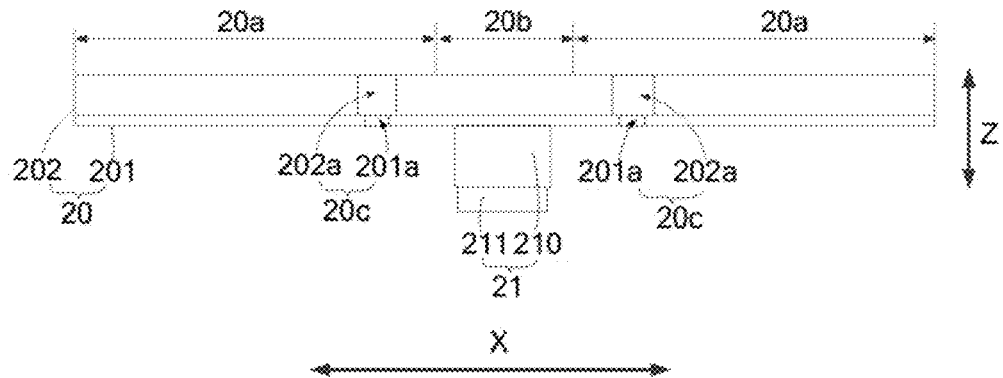
FIGS. 7 to 8 are schematic structural diagrams of auxiliary attaching structures in attaching apparatuses under a first viewing angle according to different embodiments of the present disclosure.
Figure 8:
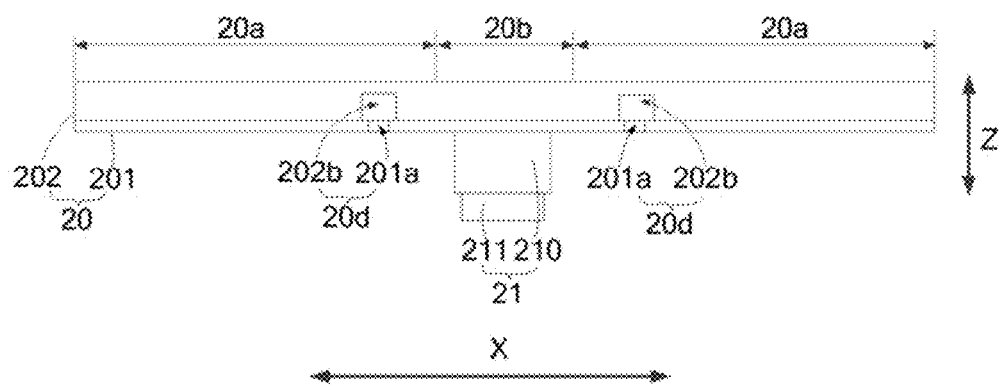

In some embodiments, as shown in FIG. 4, the pressing jig 22 can be a roller structure, but it is not limited thereto. When the pressing jig 22 is the roller structure, the pressing jig 22 can roll in a second direction Y (as shown in FIGS. 3 and 6) and apply the pressure to the protective film layer 20, so that the rigid structural member is attached to the installation area 10a of the flexible touch display substrate through the adhesive layer 12. It should be noted that, as shown in FIG. 4 and FIG. 11, during the attaching process, both ends of the roller structure in the first direction X can extend out of outer edges of the rigid structural member, so as to ensure that all areas of the rigid structural member can be rolled by the roller structure at the same time.

It should be noted that the second direction Y mentioned in the present disclosure is orthogonal to the first direction X.

Figure 9:
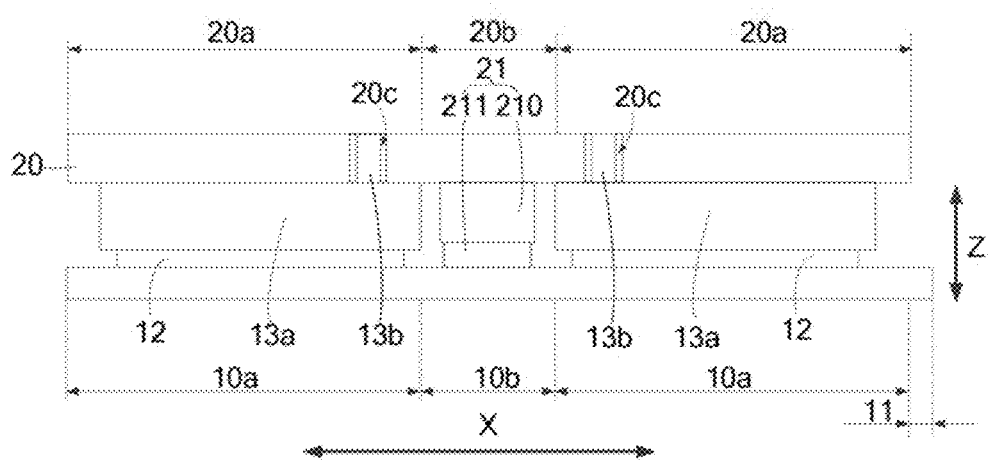
FIGS. 9 to 14 are schematic diagrams of assembly relationships between auxiliary attaching structures in attaching apparatuses and display devices according to different embodiments of the present disclosure.
Figure 10:
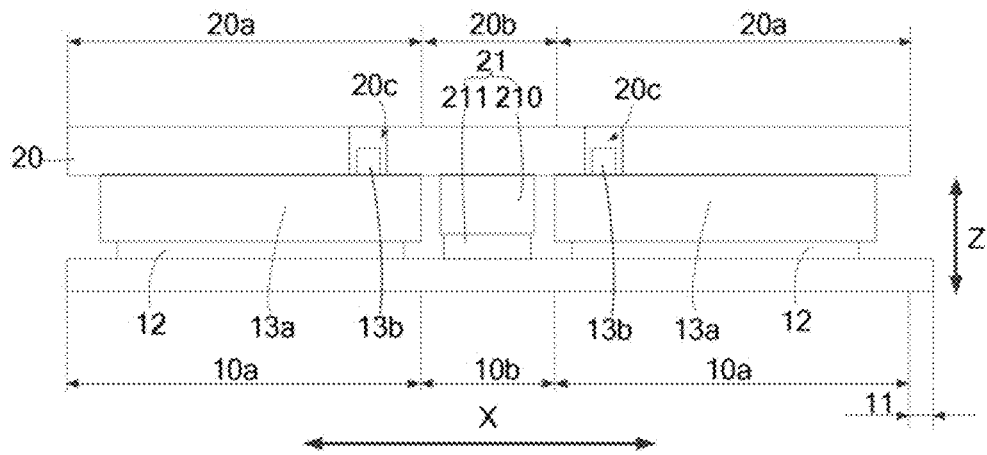

In some embodiments, as shown in FIG. 9, a thickness of the protective film layer 20 may be equal to a thickness of the installation protrusion 13b, and the position on the first area 20a of the protective film layer 20 corresponding to the installation protrusion 13b is opened with the avoidance through hole 20c. It should be noted that an overall rigidity of the protective film layer 20 should be substantively the same as a rigidity of the installation protrusion 13b. Alternatively, as shown in FIG. 10 and FIG. 11, the thickness of the protective film layer 20 may be greater than the thickness of the installation protrusion 13b, and the position on the first area 20a of the protective film layer 20 corresponding to the installation protrusion 13b is opened with the avoidance through hole 20c or the avoidance groove 20d. It should be noted that when the position on the first area 20a of the protective film layer 20 corresponding to the installation protrusion 13b is opened with the avoidance through hole 20c, the overall rigidity of the protective film layer 20 may be less than the rigidity of the installation protrusions 13b. In this way, while realizing the avoidance for the installation protrusion 13b, it can be ensured that a surface of the protective film layer 20 in contact with the pressing jig 22 is flat, and accordingly, the pressing jig 22 does not need to be provided with an escape area, so as to prevent a partial area of the protective film layer 20 from not being pressed to lead to poor attaching between the rigid structural member and the flexible touch display substrate.

Figure 11:
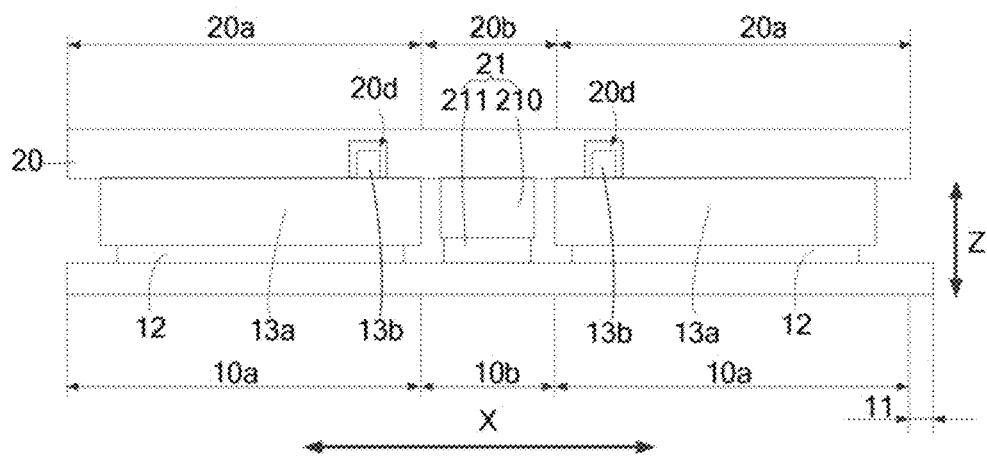

As shown in FIG. 11, the thickness of the protective film layer 20 is greater than the thickness of the installation protrusion 13b, and the position on the first area 20a of the protective film layer 20 corresponding to the installation protrusion 13b is opened with the avoidance groove 20d, so that the pressing jig 22 can better deliver an attaching pressure to the rigid structural member and the flexible touch display substrate during the pressing process.

It should be noted that, during the process of attaching the rigid structural member to the flexible touch display substrate, as shown in FIGS. 9 to 11, there may be a certain gap between the avoidance through hole 20c or the avoidance groove 20d in the protective film layer 20 and the installation protrusion 13b on the rigid structural member to meet an assembly tolerance requirement.

Figure 12:
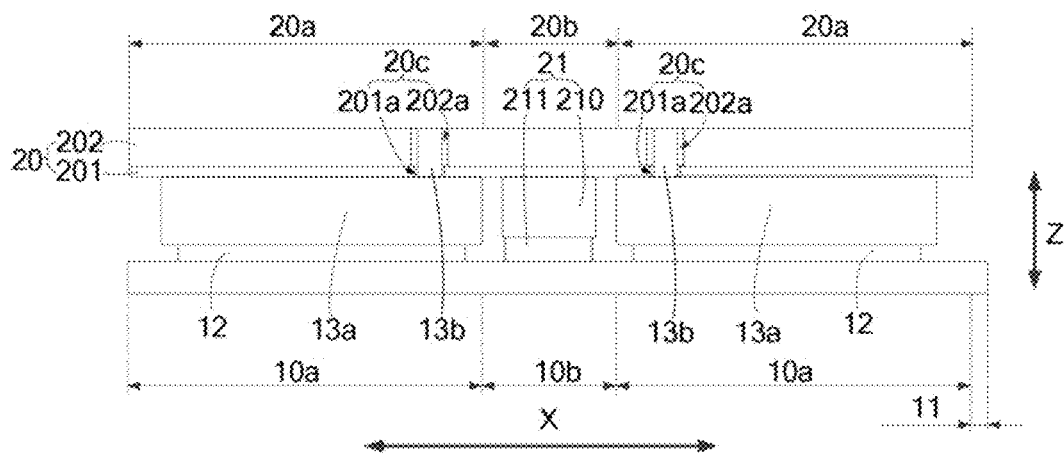
Figure 13:
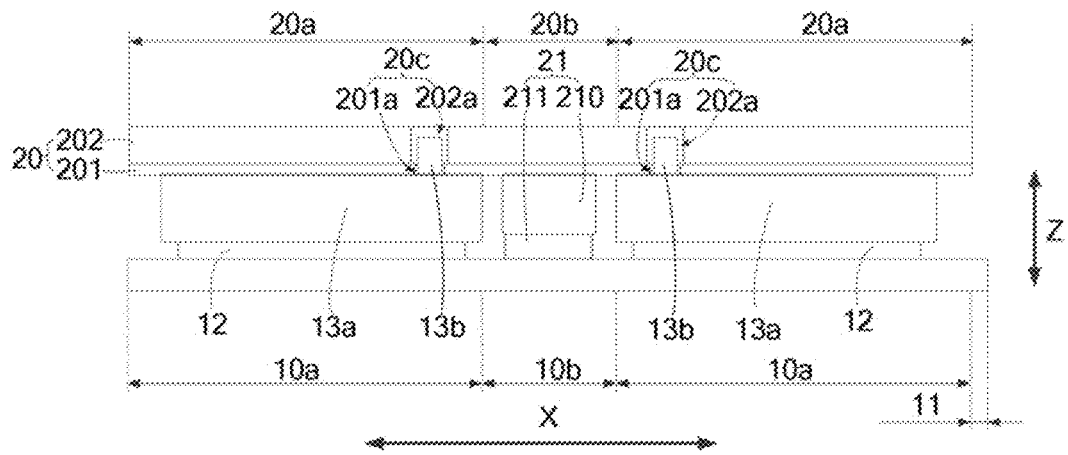
Figure 14:
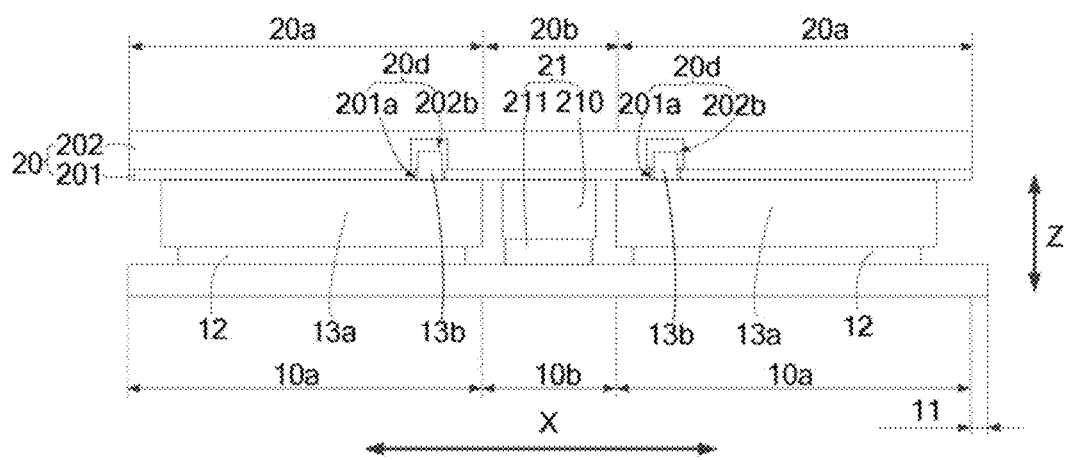

In some embodiments, as shown in FIGS. 12 to 14, the protective film layer 20 may have a multi-layer structure; specifically, the protective film layer 20 may include a first film layer 201 and a second film layer 202 formed on the first film layer 201. A side of the first film layer 201 away from the second film layer 202 is the first side of the protective film layer 20, and a side of the second film layer 202 away from the first film layer 201 is the second side of the protective film layer 20. As shown in FIG. 12 and FIG. 13, the first film layer 201 is opened with a first via hole 201a, the second film layer 202 is opened with a second via hole 202a communicating with the first via hole 201a, and the second via hole 202a and the first via hole 201a can form the avoidance through hole 20c. Alternatively, as shown in FIG. 14, the first film layer 201 is opened with the first via hole 201a, the second film layer 202 is opened with a depression part 202b communicating with the first via hole 201a, and the first via hole 201a and the depression part 202b can form the avoidance groove 20d.

In the embodiments of the present disclosure, the protective film layer 20 is provided with two film layers, so that a thickness of the second film layer 202 can be adjusted according to an actual thickness of the installation protrusion 13b without having to replace the entire auxiliary attaching structure, thereby reducing the cost, while improving the universality of the auxiliary attaching structure. It should be noted that a thickness of the first film layer 201 may be smaller than the thickness of the second film layer 202.

It should also be noted that a center line of the first via hole 201a may coincide with a center line of the second via hole 202a or a center line of the depression part 202b, and a size of the first via hole 201a may be smaller than a size of the second via hole 202a or a size of the depression part 202b. Such design can facilitate the assembly of the protective film layer 20 and the rigid structural member, while ensuring the contact area between the protective film layer 20 and the rigid structural member, so as to avoid the unbalanced force on the rigid structural member during the pressing process, and to ensure the attaching effect.

The first film layer 201 and the second film layer 202, the first film layer 201 and the body part 13a of the rigid structural member can be coupled together by means of bonding, for example, by glue or double-sided adhesive. A bonding force between the first film layer 201 and the second film layer 202 is greater than a bonding force between the first film layer 201 and the body part 13a of the rigid structural member, and such design can allow the protective film layer 20 to be torn off from the display device 1 at one time after the attaching of the rigid structural member and the flexible touch display substrate is completed.

In some embodiments, a material of the first film layer 201 is the same as or different from a material of the second film layer 202, depending on specific situations. In addition, the first film layer 201 and the second film layer 202 can be made of materials with a buffering property, so as to better balance the attaching pressure exerted by the pressing jig 22. For example, the material of the first film layer can generally be a sticky PET material or a polyimide (PI) material, etc., and the material of the second film layer can be foam, silica gel, etc., which is processed by die cutting or injection molding.

Figure 16:
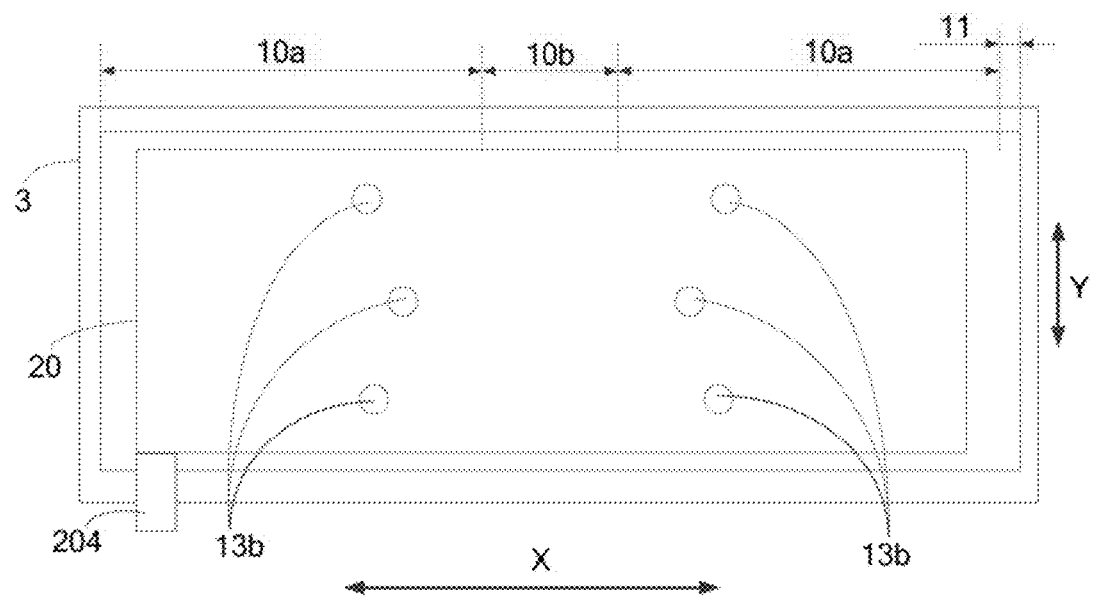
FIG. 16 is a schematic diagram of a positional relationship between an auxiliary attaching structure in an attaching apparatus and a display device on a worktable according to another embodiment of the present disclosure.

In some embodiments, as shown in FIG. 6, the protective film layer 20 may have a plurality of corners, and a protruded clamping part 204 is disposed at one of the plurality of corners. As shown in FIG. 16, when the protective film layer 20 is installed on the rigid structural member, the clamping part 204 can be protruded relative to an edge of the flexible touch display substrate, which facilitates to tear off the entire auxiliary attaching structure from the rigid structural member after the attaching of the rigid structural member with the flexible touch display substrate is completed.

Figure 17:
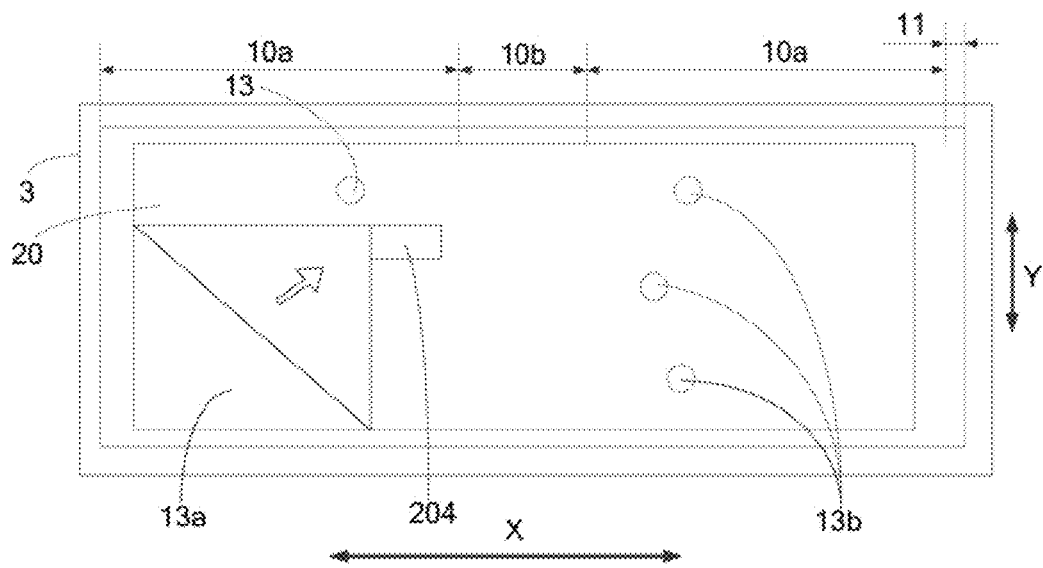
FIG. 17 is a schematic diagram of a process of tearing off an auxiliary attaching structure from a display device according to another embodiment of the present disclosure.

In some embodiments, during a tearing process, the clamping part 204 can be pulled up, and then an external force is applied obliquely upward, for example, the external force is applied along an oblique direction of 45°, and the direction of the external force can be a direction indicated by a hollow arrow as shown in FIG. 17, so as to tear off the entire auxiliary attaching structure from the rigid structural member. Such design makes the support part 21 to be inclined at a certain angle during the tearing process to avoid the risk of scratching the flexible touch display substrate. However, it should be understood that the tearing can be performed not only along the aforementioned angle, but also along other angles, as long as it can be ensured that the entire auxiliary attaching structure can be smoothly torn off from the rigid structural member without scratching the flexible touch display substrate.

It should be noted that when the protective film layer 20 is composed of the first film layer 201 and the second film layer 202, the clamping part 204 can be disposed at a corner of the second film layer 202 and is integrally formed with the second film layer 202. In this way, contact between the clamping part and the flexible touch display substrate can be avoided during the tearing process, thereby reducing the risk of the flexible touch display substrate being scratched.

In some embodiments, as shown in FIG. 6, an orthographic projection of the support part 21 in the auxiliary attaching structure on the protective film layer 20 is located within the second area 20b of the protective film layer 20, and there are gaps between the orthographic projection of the support part 21 on the protective film layer 20 and both sides of the first area 20a in the first direction X. In this way, when the first side of the first area 20a of the protective film layer 20 is attached to the body part 13a of the rigid structural member on the installation area 10a corresponding to the first area 20a, the support part 21 can be located between adjacent rigid structural members and have gaps with the adjacent rigid structural members, as shown in FIG. 11, and these gaps can meet the assembly tolerance requirement. Values of these gaps are not limited herein.

In some embodiments, a distance H between the orthographic projection of the support part 21 on the protective film layer 20 and a side of the second area 20b of the protective film layer 20 away from the clamping part 204 in the second direction Y (as shown in FIG. 6) is greater than or equal to 0, and less than or equal to 3 min, and this design can prevent the flexible touch display substrate from being easily squeezed by an end of the support part 21 away from the clamping part 204 during the process of tearing off the auxiliary attaching structure from the display device 1 along an oblique upward direction as indicated by the hollow arrow shown in FIG. 17, thereby avoiding the damage to the flexible touch display substrate.

Figure 15:
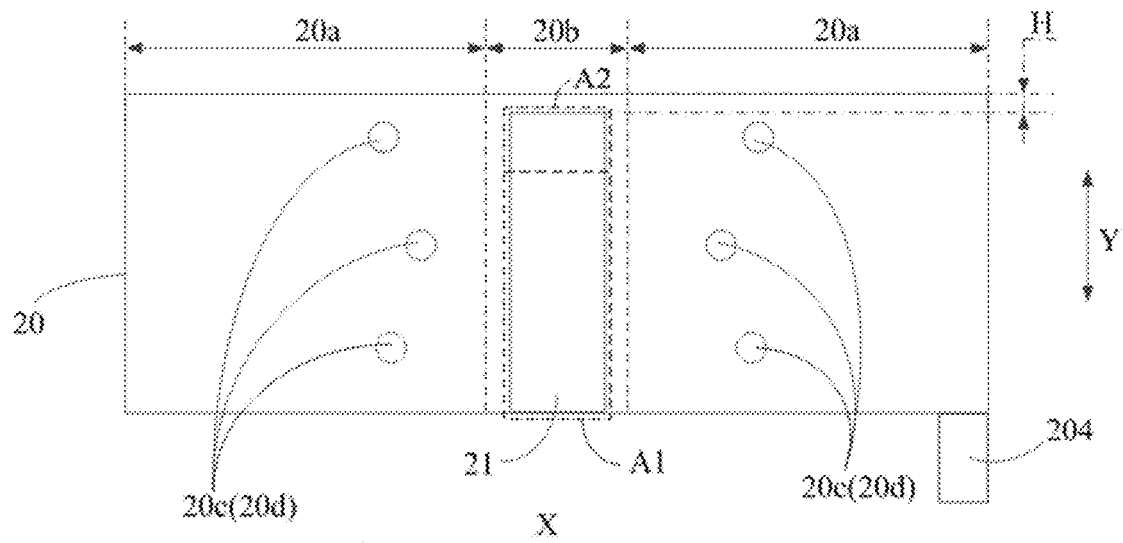
FIG. 15 is a schematic structural diagram of an auxiliary attaching structure in an attaching apparatus under a third viewing angle according to another embodiment of the present disclosure.

Further, as shown in FIG. 15, the support part 21 includes a first bonding area A1 and a second bonding area A2 arranged in the second direction Y, and the second bonding area A2 is farther away from the clamping part 204 as compared to the first bonding area A1. A bonding force between the second bonding area A2 and the second area 20b is greater than a bonding force between the first bonding area A1 and the second area 20b, so that the protective film layer 20 can be separated from the first bonding area A1 of the support part 21 first during the process of tearing off the auxiliary attaching structure from the display device 1 along the oblique upward direction as indicated by the hollow arrow shown in FIG. 17, so as to ensure that the protective film layer 20 may have a certain deformability; then it is continued to tear off the protective film layer 20 until the tearing of the protective film layer 20 reaches the second bonding area A2 of the support portion 21. Since the bonding force between the protective film layer 20 and the second bonding area A2 of the support portion 21 is relatively large, the protective film layer 20 cannot be separated from the second bonding area A2 of the support portion 21 during the process of tearing off the protective film layer 20 from the display device 1. Therefore, the protective film layer 20 can lead the entire support part 21 to be separated from the flexible touch display substrate, so that the entire auxiliary attaching structure can be torn off from the display device 1.

It should be noted that, compared with the first bonding area A1, the second bonding area A2 can be provided with an additional layer of double-sided adhesive or glue to increase the bonding force at the second bonding area A2, so that the protective film layer 20 cannot be separated from the second bonding area A2 of the support part 21 during the process of tearing off the protective film layer 20.

In some embodiments, as shown in FIG. 4, FIG. 5, and FIG. 7 to FIG. 14, the support part 21 in the auxiliary attaching structure may include a first part 210 and a second part 211, and the first part 210 is disposed on the first side of the second area 20b, the second part 211 is disposed on a side of the first part 210 away from the second area 20b. In other words, when the first side of the first area 20a of the protective film layer 20 is attached to the body part 13a of the rigid structural member on the installation area 10a corresponding to the first area 20a, the second part 211 of the support part 21 directly contacts with the bending area 10b of the flexible touch display substrate. Since the second part 211 needs to be in direct contact with the bending area 10b, in order to avoid the support part 21 from crushing the flexible touch display substrate during the pressing process, the rigidity of the second part 211 of the support part 21 can be designed to be relatively small, while in order to ensure a support strength of the support part 21, a rigidity of the first part 210 of the support part 21 can be designed to be relatively large, that is, the rigidity of the second part 211 of the support part 21 can be smaller than the rigidity of the first part 210 of the support part 21. The rigidity of the first part 210 of the support part 21 can be designed to be substantially the same as the rigidity of the body part 13a of the rigid structural member.

In addition, in the embodiments of the present disclosure, by disposing the support part 21 as two layers, a thickness of the second part 211 can be adjusted according to the actual thickness of the body part 13a of the rigid structural member without having to replace the entire auxiliary attaching structure, thereby reducing the cost, while improving the universality of the auxiliary attaching structure.

It should be noted that materials of the first part 210 and the second part 211 of the support part 21 may be metal, plastic, foam, PET, PI and other materials, and the first part 210 and the second part 211 of the support part 21 can be coupled together by means of bonding, but it is not limited to this, and other means can also be employed, as long as the coupling stability of the first part 210 and the second part 211 can be ensured.

An orthographic projection of the second part 211 of the support part 21 on the protective film layer 20 can be located within an orthographic projection of the first part 210 on the protective film layer 20, which can avoid a situation that the adhesive layer 12 of the installation area 10*a* of the flexible touch display substrate flows to the second part 211 of the support part 21 and is bonded to the second part 211 during the pressing process, thereby facilitating the subsequent separation of the auxiliary attaching structure from the display device 1 when the pressing is completed.

In some embodiments, as shown in FIGS. 2 and 3, the installation protrusion 13*ab* is located on a portion of the body part 13*a* adjacent to the bending area 10*b*, and the main flexible circuit board 14 and the touch flexible circuit board 15 can be located on a portion of the body part 13*a* away from the bending area 10*b*. As shown in FIG. 6, the avoidance through hole 20*c* or the avoidance groove 20*d* is located in a portion of the first area 20*a* adjacent to the second area 20*b*.

Figure 18:
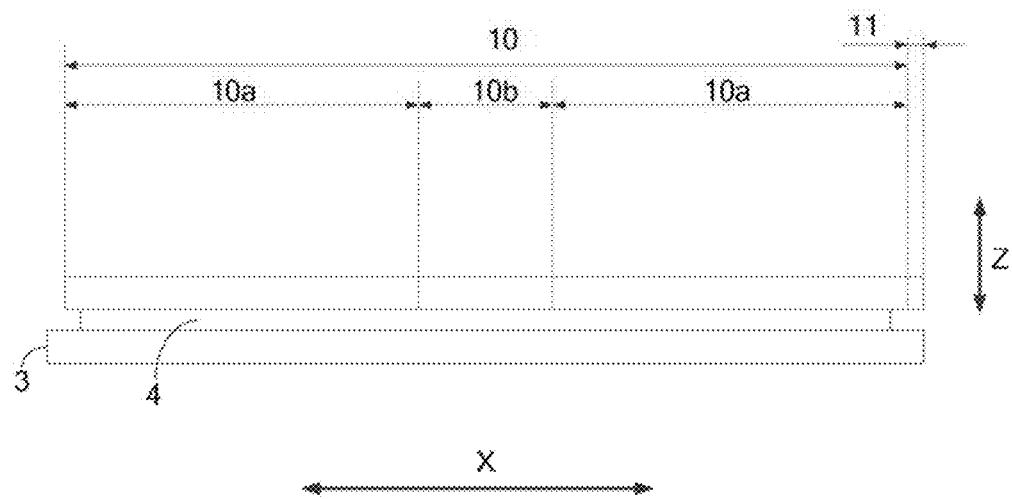
FIGS. 18 to 22 are schematic diagrams of display devices, attaching apparatuses, and positional relationships between the display devices and the attaching apparatuses in different steps of an attaching method according to an embodiment of the present disclosure.
Figure 19:
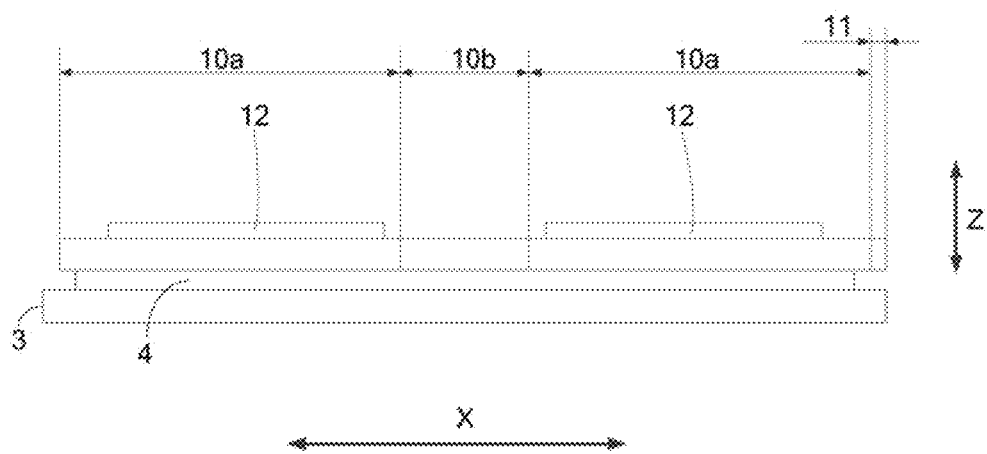
Figure 20:
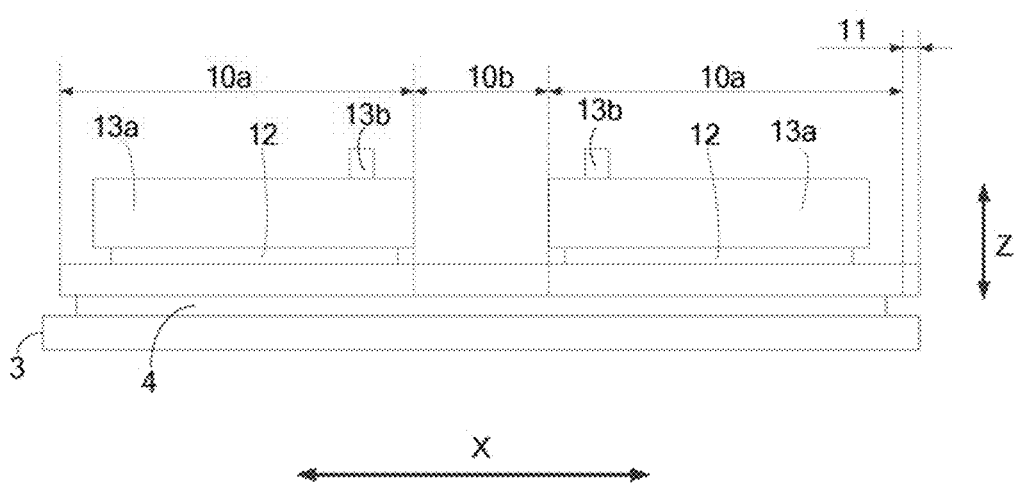
Figure 21:
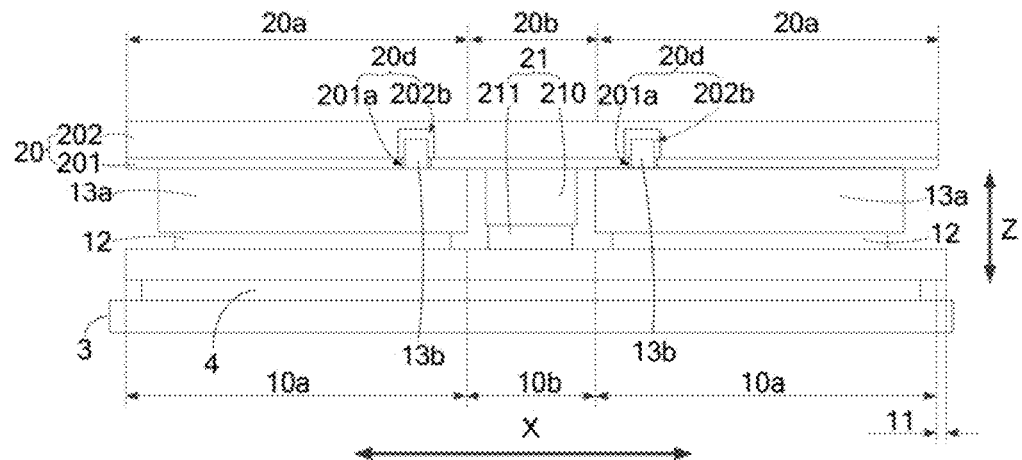
Figure 22:
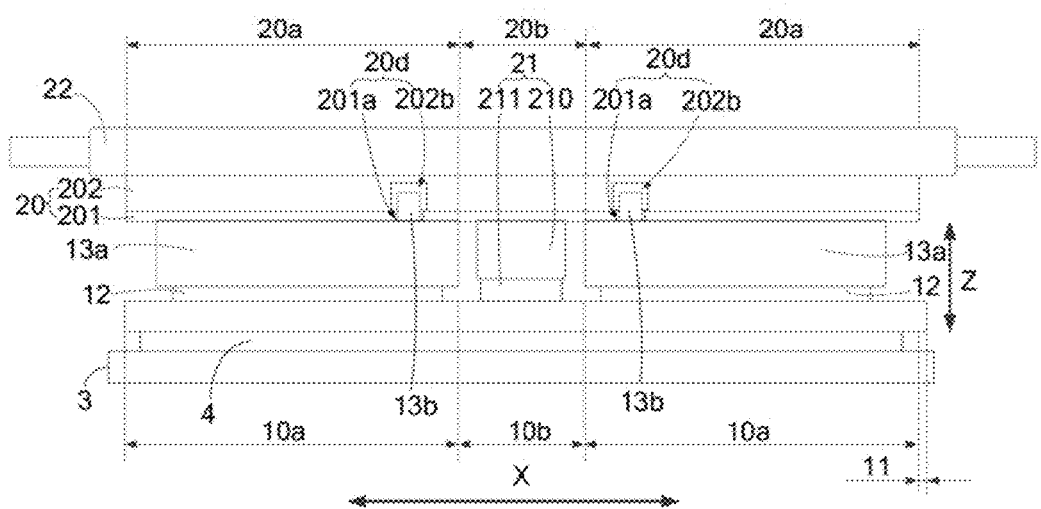
Figure 23:
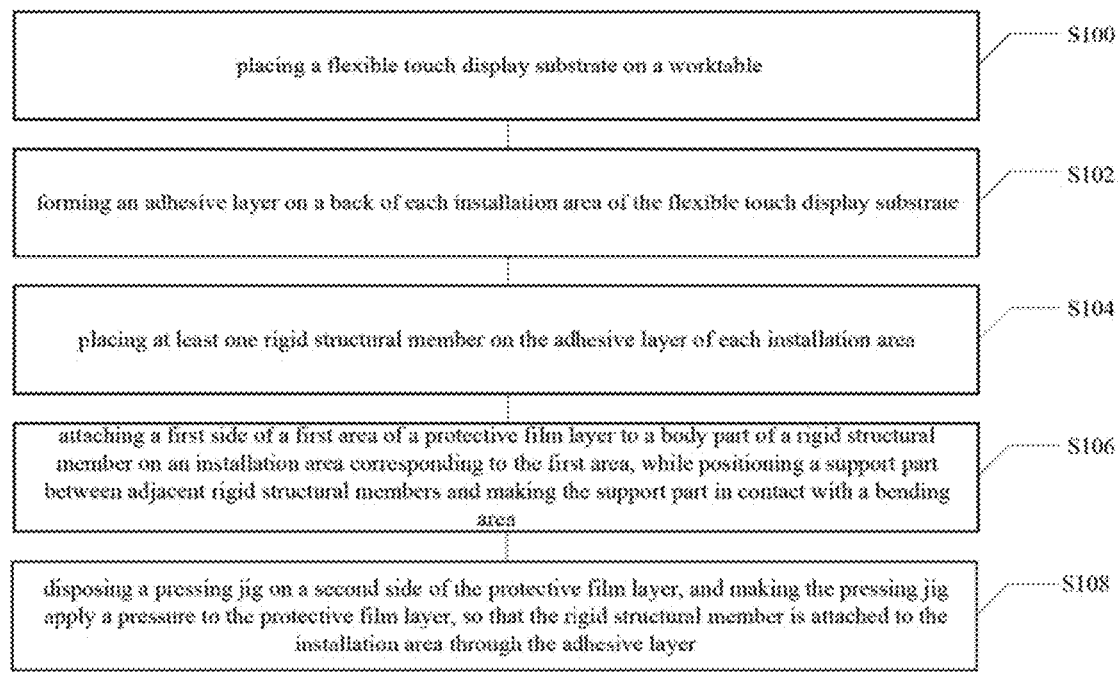
FIG. 23 is a schematic flowchart of an attaching method according to an embodiment of the present disclosure.

An embodiment of the present disclosure also provides an attaching method, which can use the attaching apparatus described in any of the foregoing embodiments, so as to attach the plurality of rigid structural members to the flexible touch display substrate. For the specific structure of the attaching apparatus, reference may be made to the structure described in the foregoing relevant description, which will not be repeated here. As shown in FIG. 23, the attaching method includes:

in step S100, the flexible touch display substrate is placed on a worktable 3, as shown in FIG. 18; specifically, the flexible touch display substrate can be attached to the worktable 3 through a vacuum adsorption structure 4 to avoid the movement of the flexible touch display substrate during the subsequent pressing process;

in step S102, the adhesive layer 12 is formed on the back of each installation area 10*a* of the flexible touch display substrate, as shown in FIG. 19;

in step S104, at least one rigid structural member is placed on the adhesive layer 12 of each installation area 10*a*, as shown in FIG. 20;

in step S106, the first side of the first area 20*a* of the protective film layer 20 is attached to the body part 13*a* of the rigid structural member on the installation area 10*a* corresponding to the first area 20*a*, and at the same time, the support part 21 is positioned between the adjacent rigid structural members and in contact with the bending area 10*b*, as shown in FIG. 21; and in step S108, the pressing jig 22 is disposed on the second side of the protective film layer 20, making the pressing jig 22 apply the pressure to the protective film layer 20, so that the rigid structural member is attached to the installation area 10*a* through the adhesive layer 12, as shown in FIG. 22.

In the embodiments of the present disclosure, since the support part 21 can be in contact with the bending area 10*b*, the support part 21 can share the stress generated during the pressing process, so as to avoid the occurrence of relatively obvious film prints due to the stress concentration at the edge of the rigid structural member during the pressing process, thereby ensuring the quality of pressing and improving the appearance and texture of the product. In addition, during the attaching process of the rigid structural member and the flexible touch display substrate, the use of the auxiliary attaching structure can balance the stress in each area of the flexible touch display substrate, so as to avoid damage to the flexible touch display substrate.

It should be noted that although the various steps of the method of the present disclosure are described in a particular order in the figures, this is not required or implied that the steps must be performed in the specific order, or all the steps shown must be performed to achieve the desired result. Additionally or alternatively, certain steps may be omitted, multiple steps may be combined into one step, and/or one step may be decomposed into multiple steps and so on. Furthermore, some of the above steps may be performed in parallel or sequentially, etc., and are not limited to a specific operation order described above.

After the first side of the first area 20*a* of the protective film layer 20 is attached to the body part 13*a* of the rigid structural member on the installation area 10*a* corresponding to the first area 20*a*, the support part 21 is located between the adjacent rigid structural members and there are gaps between the support part 21 and the body parts 13*a* of the adjacent rigid structural members.

After the rigid structural member is attached to the installation area 10*a* through the adhesive layer 12, the clamping part 204 of the protective film layer 20 is clamped and a tensile force is applied to the clamping part 204, as shown in FIG. 17, so as to remove the auxiliary attaching structure from the rigid structural member.

In addition, after the auxiliary attaching structure is removed from the rigid structural member, the attaching method may further include:

in step S110, the main flexible circuit board 14 is disposed on a body part 13*a* of a rigid structural member corresponding to an installation area 10*a*, as shown in FIG. 2 and FIG. 3; and in step S112, an end of the touch flexible circuit board 15 away from the touch display part 10 is bent onto a body part 13*a* of a rigid structural member corresponding to another installation area 10*a*, as shown in FIGS. 2 and 3.

The step S110 and the step S112 may be completed simultaneously; or the step S110 may be completed first, and then the step S112 may be completed; or the step S112 may be completed first, and then the step S110 may be completed.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. An attaching apparatus for attachment of a display device, wherein the display device comprises:
   a flexible touch display substrate, comprising at least two installation areas arranged at intervals in a first direction and a bending area located between adjacent installation areas, wherein a back of each installation area is provided with an adhesive layer; and
   a plurality of rigid structural members, each comprising a body part and an installation protrusion formed on the body part and protruding in a direction away from the flexible touch display substrate, wherein at least one of the plurality of rigid structural members is installed on the adhesive layer of the installation area wherein the attaching apparatus comprises:

an auxiliary attaching structure, comprising a protective film layer and a support part, wherein the protective film layer has a first side and a second side opposite in a thickness direction of the protective film layer, and the thickness direction is orthogonal to the first direction; and a pressing jig, disposed on the second side of the protective film layer;

wherein the protection film layer comprises at least two first areas arranged at intervals in the first direction and a second area located between adjacent first areas;

each first area is used for corresponding to one installation area, the first side of the first area is used for attaching to a body part of a rigid structural member on the installation area corresponding to the first area, and a position on the first area corresponding to the installation protrusion is opened with an avoidance through hole or an avoidance groove;

the second area is used for corresponding to the bending area, the support part is disposed on the first side of the second area, and the support part is used for contacting with the bending area when the first side of the first area is attached to the body part of the rigid structural member corresponding to the first area; and the pressing jig is used for applying a pressure to the protective film layer after the first side of the first area is attached to the body part of the rigid structural member corresponding to the first area, so that the rigid structural member is attached to the installation area through the adhesive layer.

2. The attaching apparatus according to claim 1, wherein, a thickness of the protective film layer is equal to a thickness of the installation protrusion, and the position on the first area of the protective film layer corresponding to the installation protrusion is opened with the avoidance through hole; or the thickness of the protective film layer is greater than the thickness of the installation protrusion, and the position on the first area of the protective film layer corresponding to the installation protrusion is opened with the avoidance through hole or the avoidance groove.

3. The attaching apparatus according to claim 2, wherein the protective film layer comprises a first film layer and a second film layer formed on the first film layer, a side of the first film layer away from the second film layer is the first side, and a side of the second film layer away from the first film layer is the second side;

the first film layer is opened with a first via hole, the second film layer is opened with a second via hole in communication with the first via hole, and the avoidance through hole is formed by the second via hole and the first via hole; or the first film layer is opened with the first via hole, the second film layer is opened with a depression part in communication with the first via hole, and the avoidance groove is formed by the first via hole and the depression part.

4. The attaching apparatus according to claim 3, wherein the first film layer and the second film layer are coupled by means of bonding, and the first film layer and the body part of the rigid structural member are coupled by means of bonding; and a bonding force between the first film layer and the second film layer are greater than a bonding force between the first film layer and the rigid structural member.

5. The attaching apparatus according to claim 1, wherein the protective film layer has a plurality of corners, a clamping part is disposed at one of the plurality of corners; and the clamping part is configured to be protruded relative to an edge of the flexible touch display substrate in a case where the first side of the first area is attached to the body part of the rigid structural member corresponding to the first area.

6. The attaching apparatus according to claim 5, wherein:

an orthographic projection of the support part on the protective film layer is located within the second area, and there are gaps between the orthographic projection of the support part on the protective film layer and both sides of the second area in the first direction; and a distance between the orthographic projection of the support part on the protective film layer and a side of the second area away from the clamping part in a second direction is greater than or equal to 0, and less than or equal to 3 mm, and the second direction is orthogonal to the first direction.

7. The attaching apparatus according to claim 6, wherein the support part comprises a first bonding area and a second bonding area arranged in the second direction, and the second bonding area is farther away from the clamping part than the first bonding area; and a bonding force between the second bonding area and the second area is greater than a bonding force between the first bonding area and the second area.

8. The attaching apparatus according to claim 6, wherein the support part comprises a first part and a second part, the first part is disposed on the first side of the second area, and the second part is disposed on a side of the first part away from the second area; and a rigidity of the second part is smaller than a rigidity of the first part.

9. The attaching apparatus according to claim 1, wherein:

the avoidance through hole or the avoidance groove is located on a portion of the first area adjacent to the second area.

10. The attaching apparatus according to claim 1, wherein the pressing jig is a roller structure.

11. An attaching method for attachment of a display device, wherein an attaching apparatus is used in the attaching method, and the display device comprises:

a flexible touch display substrate, comprising at least two installation areas arranged at intervals in a first direction and a bending area located between adjacent installation areas, wherein a back of each installation area is provided with an adhesive layer; and a plurality of rigid structural members, each comprising a body part and an installation protrusion formed on the body part and protruding in a direction away from the flexible touch display substrate, wherein at least one of the plurality of rigid structural members is installed on the adhesive layer of the installation area;

wherein the attaching apparatus comprises:

an auxiliary attaching structure, comprising a protective film layer and a support part, wherein the protective film layer has a first side and a second side opposite in a thickness direction of the protective film layer, and the thickness direction is orthogonal to the first direction; and a pressing jig, disposed on the second side of the protective film layer;

wherein the protection film layer comprises at least two first areas arranged at intervals in the first direction and a second area located between adjacent first areas;

each first area is used for corresponding to one installation area, the first side of the first area is used for attaching to a body part of a rigid structural member on the installation area corresponding to the first area, and a position on the first area corresponding to the installation protrusion is opened with an avoidance through hole or an avoidance groove;

the second area is used for corresponding to the bending area, the support part is disposed on the first side of the second area, and the support part is used for contacting with the bending area when the first side of the first area is attached to the body part of the rigid structural member corresponding to the first area; and the pressing jig is used for applying a pressure to the protective film layer after the first side of the first area is attached to the body part of the rigid structural member corresponding to the first area, so that the rigid structural member is attached to the installation area through the adhesive layer, wherein the attaching method comprises:

placing the flexible touch display substrate on a worktable;

attaching the first side of the first area of the protective film layer to the body part of the rigid structural member on the installation area corresponding to the first area, while positioning the support part between adjacent rigid structural members and making the support part in contact with the bending area; and using the pressing jig to apply the pressure to the protective film layer.

12. The attaching method according to claim 11, wherein the protective film layer has a plurality of corners, a clamping part is disposed at one of the plurality of corners;

the clamping part is configured to be protruded relative to an edge of the flexible touch display substrate in a case where the first side of the first area is attached to the body part of the rigid structural member corresponding to the first area; and after the rigid structural member is attached to the installation area through the adhesive layer, the method further comprises:

removing the auxiliary attaching structure from the rigid structural member by applying a tensile force to the clamping part.

13. The attaching method according to claim 12, wherein:

an orthographic projection of the support part on the protective film layer is located within the second area, and there are gaps between the orthographic projection of the support part on the protective film layer and both sides of the second area in the first direction; and a distance between the orthographic projection of the support part on the protective film layer and a side of the second area away from the clamping part in a second direction is greater than or equal to 0, and less than or equal to 3 mm, and the second direction is orthogonal to the first direction.

14. The attaching method according to claim 13, wherein the support part comprises a first bonding area and a second bonding area arranged in the second direction, and the second bonding area is farther away from the clamping part than the first bonding area; and a bonding force between the second bonding area and the second area is greater than a bonding force between the first bonding area and the second area.

15. The attaching method according to claim 13, wherein the support part comprises a first part and a second part, the first part is disposed on the first side of the second area, and the second part is disposed on a side of the first part away from the second area; and a rigidity of the second part is smaller than a rigidity of the first part.

16. The attaching method according to claim 11, wherein when the first side of the first area is attached to the body part of the rigid structural member corresponding to the first area, there is a gap between the support part and a body part of an adjacent rigid structural member.

17. The attaching method according to claim 11, wherein, a thickness of the protective film layer is equal to a thickness of the installation protrusion, and the position on the first area of the protective film layer corresponding to the installation protrusion is opened with the avoidance through hole; or the thickness of the protective film layer is greater than the thickness of the installation protrusion, and the position on the first area of the protective film layer corresponding to the installation protrusion is opened with the avoidance through hole or the avoidance groove.

18. The attaching method according to claim 17, wherein the protective film layer comprises a first film layer and a second film layer formed on the first film layer, a side of the first film layer away from the second film layer is the first side, and a side of the second film layer away from the first film layer is the second side;

the first film layer is opened with a first via hole, the second film layer is opened with a second via hole in communication with the first via hole, and the avoidance through hole is formed by the second via hole and the first via hole; or the first film layer is opened with the first via hole, the second film layer is opened with a depression part in communication with the first via hole, and the avoidance groove is formed by the first via hole and the depression part.

19. The attaching method according to claim 18, wherein the first film layer and the second film layer are coupled by means of bonding, and the first film layer and the body part of the rigid structural member are coupled by means of bonding; and a bonding force between the first film layer and the second film layer are greater than a bonding force between the first film layer and the rigid structural member.

20. The attaching method according to claim 11, wherein:

the avoidance through hole or the avoidance groove is located on a portion of the first area adjacent to the second area.

* * * * *